Jan. 3, 1967 C. PRITCHARD ETAL 3,295,185

CONTACTING OF P-N JUNCTIONS

Filed Oct. 15, 1963

INVENTORS.
COLIN PRITCHARD
GIAN C. DELLA PERGOLA
BY
C. L. Menzemer
ATTORNEY.

3,295,185
Patented Jan. 3, 1967

3,295,185

CONTACTING OF P-N JUNCTIONS

Colin Pritchard, Birmingham, England, and Gian C. Della Pergola, Naples, Italy, assignors to Westinghouse Electric Corporation, Pittsburgh, Pa., a corporation of Pennsylvania Filed Oct. 15, 1963, Ser. No. 318,144
3 Claims. (Cl. 29—25.3)

This invention is concerned with a method of making electrical contact to a small area p-n junctions and functional elements in a body of semiconductor material.

The alloying of selected areas of evaporated metal films on a body of a semiconductor material by use of well developed techniques including the use of an electron beam is known. Conventionally, after alloying has been accomplished in this manner, metal unused in the junction forming process is removed from the surface of the structure, usually by chemical etching.

In the microminiaturization of semiconductor structures, it is the intent and practice to make p-n junctions and other functional portions smaller and smaller. The problems of making contact with the resulting p-n junctions and functional elements becomes correspondingly greater and greater. Techniques heretofore used to make contacts may be no longer applicable, and new techniques are necessary to achieve the needed results.

An object of the present invention to to provide a method whereby small area alloyed p-n junctions and other functional elements can be effectively produced and electrical contacts can readily be made thereto in semiconductor structures.

Other objects will be apparent from the following detailed description and the attached drawing, in which.

It should be understood that the drawings are adapted for visual clarity and are not to scale.

The objects of the invention are achieved in accordance with our discoveries by a process in which a surface of a body of semiconductive material of a first conductivity type is provided with an insulating surface thereon, as by oxidizing it. Thereafter, a material that will produce a p-n junction upon alloying with the body of semiconductor material is applied to the surface of the layer of insulation. Localized alloying is effected by procedures described herein to make the junction. There remains a relatively large amount of the alloying material that is in good electrical contact with the junction surface but is electrically insulated from the rest of the semiconductor body. Good ohmic contacts or leads can readily be attached to that residual. In this simple fashion, good contacts are provided to small area junctions while avoiding the tedious practices heretofore necessary to secure analogous results.

For ease of description and understanding, the invention will be further described in terms relating specifically to the preparation of a semiconductor structure in which semiconductive silicon is used. However, it should be understood that other semiconductive materials can be used such, for example, as geranium silicon carbide and III–V compounds, to provide analogous can be used such, for example, as germanium silicon or other semiconductive material can be processed so that the semiconductivity may be reversed from that shown.

Figure 1:
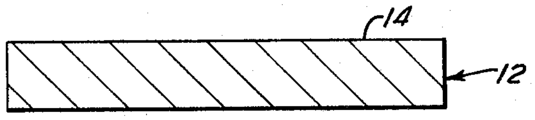
FIGURE 1 is a side view of a wafer of semiconductive material used in preparing a semiconductor device in accordance with the invention.

Referring to the drawing, in FIG. 1, there is illustrated a single crystal silicon wafer 12 that is of either p- or n-type semiconductivity. The wafer 12 can be prepared by any of the many methods available in the art. By way of example, a single crystal silicon rod can be pulled from a melt of silicon containing at least one element from Groups III or V of the Periodic Table, depending on the type semiconductivity desired. A wafer can be cut from the rod with, for example, a diamond saw; lapping, etching and like techniques are used to provide smooth surfaces. A section of a dendritic crystal can also be used as the semiconductive material.

Figure 2:
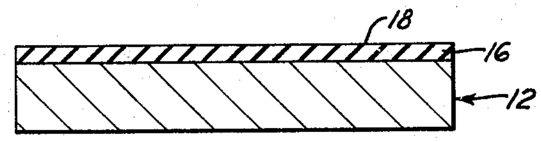
FIG. 2 is a side view of the semiconductive wafer after oxidation of its upper surface.

Considering the crystal 12 to be silicon of n-type semiconductivity, the process is continued as follows. With reference to FIG. 2, on upper major surface 14 of wafer 12, there is provided an insulating layer 16 such as for example, suitable silicon dioxide. The layer of silicon dioxide can be formed by heating the silicon wafer in an atmosphere of air saturated with water vapor at a temperature of about 1200° C. or higher for a few minutes to several hours. If desired, the oxide layer can also be produced by anodic oxidation or other known techniques. Generally, the oxide layer produced by any technique is within the range of about 100 to 10,000 A. or more in thickness, and preferably about 1500 to 4000 A.

Figure 3:
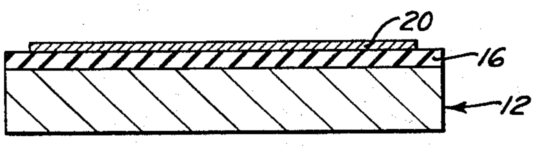
FIG. 3 is a view of the wafer of FIG. 2 showing a layer of metal on the surface of the oxide film.

With reference to FIG. 3 following the production of the insulating oxide layer 16 on the upper surface 14 of the silicon wafer 12, a layer 20 of an acceptor material, for example, indium, gallium, aluminum or boron, is applied to that layer. If desired, the acceptor material can be applied over the entire layer 16. If a localized zone is to be coated, upper surface 18 of the oxide layer 16 can first be masked where the acceptor is not desired, and then the layer 20 of acceptor material is applied. For n-type silicon wafers, it is preferred that aluminum be used as the acceptor and this can readily be applied to the surface of the oxide layer by heating a crucible containing aluminum to a temperature within the range of about 600° to 1200° C. for several hours in a furnace containing the silicon wafer with the oxide layer exposed. The silicon wafer is maintained at a temperature below that of the aluminum in the crucible so that the vaporized aluminum will deposit thereon. There results an evaporated aluminum layer 20, generally 0.5 to 2 mils thick. It will be appreciated that the acceptor material can also be applied in the form of an alloy.

Figure 4:
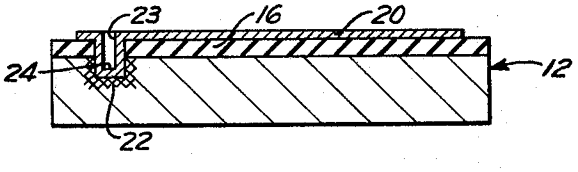
FIG. 4 is a side view of the wafer of FIG. 3 processed to provide a junction.

With reference to FIG. 4, a p-n junction is produced in the wafer 12. This is accomplished in any localized area desired by focusing on that area an electron beam with a power at least sufficient to locally melt the aluminum. The molten aluminum penetrates the oxide layer to the base silicon wafer 12 and then alloys with the semiconductive silicon in the usual manner.

Where the power supplied by the electron beam raises the temperature to a level higher than the melting point of the aluminum-silicon eutectic but lower than the melting point of silicon, alloying produces a junction very similar to conventional alloy junctions. Where the power supplied is sufficient to melt the semiconductor as well as the aluminum, the junction produced is a meltback or remelt junction. In either event, a p-n junction 22 (FIG. 4) is formed in the wafer 12. In view of the fact that sufficient power is supplied to melt the aluminum, the hole 23 through the oxide layer 16 under the aluminum layer 20 is circumferentially coated by flowing aluminum that enters the hole.

Figure 5:
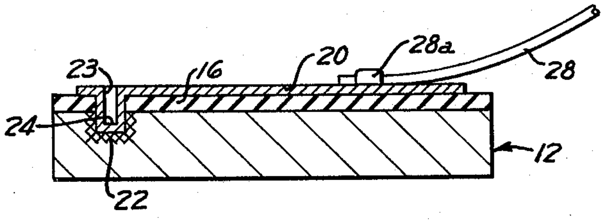
FIG. 5 is a view of the wafer of FIG. 4 showing a lead attached to the metal.
Figure 6:
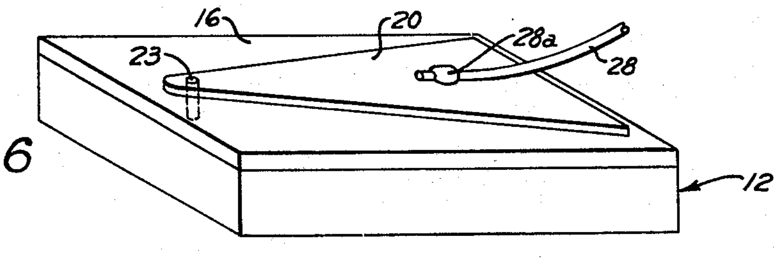
FIG. 6 is a perspective view of the wafer of FIG. 5.

With reference to FIG. 5, a lead 28 is now soldered to the aluminum layer 20 at a location remote from the junction area. This can be accomplished with any conventional solder. If desired, a conductive thermoplastic cement can also be used for this purpose.

In instances, the alloying step may result in discontinuities between the upper surface 24 of the p-region above the p-n junction 22 and the remaining aluminum 20 on the oxide layer 16. For example, this could occur with thin aluminum layers. In any event, where it occurs electrical contact can be readily re-established by evaporating more aluminum over that already in place; indeed, this step can be used at all times as a matter of insuring that contact is maintained. As is apparent, the aluminum will coat the wall of the hole as it deposits, thereby connecting the junction with the other metal.

A particular advantage of the invention is the ease with which good electrical contact is provided with the very small area junctions prepared in this manner. As noted, electrical contact exists, or is easily established, between the upper surface 24 of the p-region in the semiconductor with the remaining aluminum in layer 20. Accordingly, an electrical lead to that junction is easily achieved by attaching the lead to any portion of the aluminum layer 20 or by coating a second intermediate layer onto a localized region of the aluminum to facilitate attaching the lead.

It will be appreciated that the conditions to be used in the alloying step will vary widely. For example, where an electron beam is to be used to cause alloying, the variables will include all those characteristics of electron beam practice as well as such considerations as the thickness of the insulation and of the deposit of conductivity determining material, in addition to the nature of the specific materials involved. In general, when an electron beam is used, it is preferred to use a pulsed beam operated at conditions within the following ranges: accelerating voltage, 70–90 kv.; current, 1 to 2 milliamps; pulse length, 2.5 to 12 microseconds; pulse frequency, 500 to 3000 c.p.s. (cycles per second). However, any other operating conditions can be used as well, as long as the necessary alloying occurs.

Alloying can also be accomplished in the conventional manner; that is, the metal or other conductivity deposit can be heated in a furnace to a temperature above the deposit-semiconductor (aluminum-silicon eutectic temperature, in the above discussion) alloying temperature, resulting in the alloying of the deposit with the body of semiconductive material through the oxide coating. As is evident, here too the conditions of operation will depend on the materials involved. With silicon base structures, this normally involves heating to a temperature in the range from 600° C. to 1250° C. in an evacuated furnace for several hours. With such type alloying, it will be apparent that the aluminum (or other conductivity material) suitably is applied, initially, only where alloying is to occur. Thereafter, a deposit can be made over the resulting alloy location and a substantial portion of the oxide layer so that a lead can be easily attached.

The invention will be further exemplified with the following specific examples in which the details are given by way of illustration and are not to be construed as limiting.

*Example I*

A strip of n-type silicon, having a resistivity within the range of about 50 to 100 ohm-cm., is used. The strip is 2.5 x 0.2 x 0.05 cm. After etching the surface of the strip with concentrated hydrochloric acid to clean it, it is placed in a furnace through which air, saturated with water vapor, is passed at 1250° C. for four hours, to oxidize its surface. Then it is placed in a vacuum furnace having a container of aluminum therein. The chamber is evacuated to $10^{-5}$ mm. Hg. The aluminum is then heated to 1250° C. and maintained at that temperature for 30 minutes, resulting in the deposition of an aluminum film on the surface of the silicon strip on the order of 0.5 to 1 micron in thickness.

The strip is then placed in a target holder for an electron beam. A Zeiss electron beam machine is used in this example. A pulsed beam is used with a pulse frequency on the order of 1500 c.p.s., in which the accelerating voltage is maintained at about 80 kv., the current in the range of 1 to 2 milliamps, the pulse beam diameter is less than 1 mil and the pulse length 2.5 microseconds. Under these conditions, alloying occurs to a depth on the order of 10 microns. Then a nickel wire is attached to the surface of the aluminum deposit that is not affected by alloying the step.

A number of samples were produced under essentially similar conditions. The electrical properties of junctions obtained were satisfactory, for example having a breakdown voltage ranging up to about 200 volts at one milliamp.

In the first demonstrations of this invention, proof that the aluminum had alloyed with the silicon substrate through the oxide layer was provided as follows: the aluminum film remaining on the surface after alloying was dissolved off the oxide by use of aqueous hydrochloric acid. Then the oxide was removed by the use of aqueous hydrofluoric acid. The position of the aluminum that had been melted through the oxide was visible. That this consisted of aluminum doped silicon was confirmed by heating the silicon to 1100° C. for 17 hours. Examination then showed that aluminum had diffused from the aluminum doped area into the silicon. This was revealed by angle lapping the specimen and staining the resulting diffused p-type regions. The stains resulting clearly demonstrated a line of demarcation where diffusion had occurred.

From the foregoing discussion and description, it is apparent that the present invention constitutes a uniquely simply but effective way of making good contact to small area junctions and functional elements in semiconductor structures. It is evident that the principle of the invention involves alloying from a deposit of metal through an insulating coating to a semiconductive material. Thus, a contact can be readily achieved to a small area junction. Similarly, ohmic contacts can be provided at localized areas of semiconductors by making the metal deposit on the oxide of the same conductivity as the wafer and then alloying. This is particularly useful to obtain contact with a functional zone in a semiconductive body. It should also be appreciated that the advantages of the invention can be achieved other than as specifically described. For example, the conductivity determining material can be applied to an oxide layer on a semiconductive material in strips, using conventional masking techniques. After alloying, continuity of the strips on the oxide can be re-established through the mask, and then leads attached as before. Of course, the invention can be practiced with other semiconductive materials, for example germanium. An oxide layer on germanium can be obtained by heating in moist air, or by anodic techniques. For n-type germanium, indium is the preferred acceptor. For p-type substrates of either germanium or silicon, arsenic and phosphorus are the preferred donor materials though other donors could be used as well. Other variations will be apparent to those skilled in the art.

In accordance with the provisions of the patent statutes, we have described the invention with what is now considered to be its best embodiment. However, it should be understood that the invention can be practiced otherwise than as specifically described.

We claim:

1. A process for forming a p-n junction in a body of semiconductor material and making electrical contact therewith consisting of (1) applying an unbroken layer of an insulating material to a surface of a body of semiconductor material having a first semiconductivity, (2) applying an unbroken layer of an electrically conductive material to the surface of the insulating material that upon alloying with the semiconductor material will produce a p-n junction therein, (3) thereafter locally alloying only a selected area of said material with the body of semiconductive material by localized fusion directly through the underlying portion of said insulation to form a p-n junction in the body of semiconductor material, and (4) then attaching an electrical lead to the remainder of the layer of said material whereby electrical contact is provided with the alloyed p-n junction.

2. A process for forming a p-n junction in a body of semiconductor material and making electrical contact therewith consisting of (1) applying an unbroken layer of an insulating material on a major surface of a body of semiconductor material, said body having a first semiconductivity, (2) evaporating an unbroken layer of a doping material on the surface of the insulating material that upon alloying with the body of semiconductor material will produce a p-n junction therein, (3) thereafter locally alloying a selected portion of the doping material with the body of semiconductor material by localized fusion through the underlying portion of said insulation to form a p-n junction in the body of semiconductor material, (4) applying additional quantities of said doping material over said first layer of doping material including the local area where alloying has occurred, and, (5) making electrical contact with said junction by attaching a lead to the unalloyed portion of the doping material.

3. The method of claim 2 in which alloying is effected by applying an electron beam to the unbroken layer of doping material on the unbroken layer of insulation at the location that the junction is to be produced.

References Cited by the Examiner

UNITED STATES PATENTS

| | | | |
|---|---|---|---|
| 2,805,968 | 9/1957 | Dunn | 148—179 |
| 2,944,321 | 7/1960 | Westberg | 148—33.5 X |
| 2,981,877 | 4/1961 | Noyce. | |
| 3,044,147 | 7/1962 | Armstrong | 29—25.3 |
| 3,080,481 | 3/1963 | Robinson. | |
| 3,169,892 | 2/1965 | Lemelson | 29—155.7 X |
| 3,179,542 | 4/1965 | Quinn | 148—177 |

OTHER REFERENCES

IBM Tech. Bull., vol. 3, No. 12, May 1961, pages 30 and 31.

JOHN F. CAMPBELL, *Primary Examiner.*

WHITMORE A. WILTZ, *Examiner.*

W. I. BROOKS, *Assistant Examiner.*